United States Patent
Ridgers et al.

(10) Patent No.: US 9,548,701 B2
(45) Date of Patent: Jan. 17, 2017

(54) BIAS CIRCUIT FOR A TRANSISTOR AMPLIFIER

(71) Applicants: Timothy John Ridgers, Caen (FR); Louis Praamsma, Nijmegen (NL)

(72) Inventors: Timothy John Ridgers, Caen (FR); Louis Praamsma, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/635,616

(22) Filed: Mar. 2, 2015

(65) Prior Publication Data

US 2016/0190992 A1 Jun. 30, 2016

(30) Foreign Application Priority Data

Mar. 17, 2014 (EP) .................................... 14290067

(51) Int. Cl.
 *H03F 3/04* (2006.01)
 *H03F 1/02* (2006.01)
 *H03F 1/30* (2006.01)
 *H03F 3/19* (2006.01)

(52) U.S. Cl.
 CPC ............ *H03F 1/0222* (2013.01); *H03F 1/302* (2013.01); *H03F 3/19* (2013.01); *H03F 2200/165* (2013.01); *H03F 2200/18* (2013.01); *H03F 2200/294* (2013.01); *H03F 2200/447* (2013.01); *H03F 2200/451* (2013.01); *H03F 2200/453* (2013.01); *H03F 2200/456* (2013.01); *H03F 2200/471* (2013.01)

(58) Field of Classification Search
 CPC ........................................................ H03F 3/04

USPC .......................................... 330/296, 127, 136
See application file for complete search history.

(56) References Cited

U.S. PATENT DOCUMENTS

| 6,424,225 | B1 * | 7/2002 | Choi ........................ H03F 1/302 323/312 |
| 6,452,456 | B1 * | 9/2002 | Gharpurey .............. H03F 1/302 330/283 |
| 6,778,019 | B2 * | 8/2004 | Grasset ................... H03F 1/302 330/290 |

(Continued)

OTHER PUBLICATIONS

Extended European Search Report for application 14290067.9 (Oct. 22, 2014).

*Primary Examiner* — Patricia T Nguyen (57) ABSTRACT

A bias circuit for a transistor amplifier, the bias circuit comprising a low-pass filter block, a reference transistor, a sum node, a reference current source, and a current difference block, wherein
 the low-pass filter block is configured to sense a DC bias voltage at a control terminal of the transistor amplifier and provide the DC bias voltage to a control terminal of the reference transistor;
 the reference transistor is configured to output a bias current in response to the DC bias voltage and provide the bias current to the sum node;
 the sum node is configured to receive a reference current from the reference current source and combine the reference current with the bias current from the reference transistor to provide a difference current; and
 the current difference block is configured to receive the difference current from the sum node and provide the difference current to the control terminal of the transistor amplifier.

20 Claims, 6 Drawing Sheets

(56) References Cited

U.S. PATENT DOCUMENTS

| | | | |
|---|---|---|---|
| 6,842,075 B2* | 1/2005 | Johnson | G05F 3/265 |
| | | | 330/288 |
| 6,873,211 B1* | 3/2005 | Thompson | H03F 1/301 |
| | | | 330/285 |
| 7,202,736 B1* | 4/2007 | Dow | H03F 1/14 |
| | | | 330/129 |
| 7,345,547 B2* | 3/2008 | Wang | H03F 1/30 |
| | | | 330/285 |
| 7,714,659 B2 | 5/2010 | Leitner | |
| 7,728,671 B2* | 6/2010 | Blair | H01L 23/66 |
| | | | 330/290 |
| 2007/0139120 A1 | 6/2007 | Luo et al. | |
| 2009/0146741 A1 | 6/2009 | Okuma | |
| 2010/0271136 A1 | 10/2010 | Zhang et al. | |
| 2014/0167854 A1* | 6/2014 | Ding | H03F 1/0272 |
| | | | 330/285 |

\* cited by examiner

BIAS CIRCUIT FOR A TRANSISTOR AMPLIFIER

CROSS-REFERENCE TO RELATED APPLICATIONS

This application claims the priority under 35 U.S.C. §119 of European patent application no. 14290067.9, filed on Mar. 17, 2014, the contents of which are incorporated by reference herein.

The present disclosure relates to the field of amplifiers, and in particular, to a bias circuit for a transistor amplifier.

Often the behaviour of a radio frequency (RF) stage is determined by its biasing current, which should be non-intrusive and render the stage performance as ideal as possible, independent of external influences such as variations to the supply voltage or the operating temperature. In the case of a common-emitter transistor low-noise amplifier (LNA), the emitter is connected to ground, either directly or through a degeneration inductance. One role of a bias circuit is to provide the base voltage. This can be through an inductance, such that for low frequencies the bias circuit provides a voltage source, and at RF frequencies the bias circuit presents a high impedance introducing no loss. However, integrated inductors take up a large silicon die area and therefore represent a significant cost.

According to a first aspect, there is provided a bias circuit for a transistor amplifier, the bias circuit comprising a low-pass filter block, a reference transistor, a sum node, a reference current source, and a current difference block, wherein the low-pass filter block is configured to sense a DC bias voltage at a control terminal of the transistor amplifier and provide the DC bias voltage to a control terminal of the reference transistor;

the reference transistor is configured to output a bias current in response to the DC bias voltage and provide the bias current to the sum node;

the sum node is configured to receive a reference current from the reference current source and combine the reference current with the bias current from the reference transistor to provide a difference current; and the current difference block is configured to receive the difference current from the sum node and provide the difference current to the control terminal of the transistor amplifier.

Such a bias circuit has been found to exhibit behaviour close to an ideal inductor without the associated cost and without occupying too much silicon die area. Also, it may provide a suitable compromise between low-frequency and RF impedances with acceptably few circuit errors.

Any of the current difference blocks disclosed in this document may amplify the difference current from the sum node by a gain value of about 1, or close to 1, and may be considered as a current cascode stage.

The transistor amplifier may be one or more of a low-noise amplifier and a common-emitter amplifier. One or both of the transistor amplifier and the reference transistor may comprise a bipolar transistor or a metal-oxide-semiconductor (MOS) transistor.

The bias circuit may comprise a current compensation block configured to receive the bias current from the reference transistor and return a control current to the control terminal of the reference transistor.

The current compensation block may comprise a cascode transistor and a first current compensation mirror. The first current compensation mirror may be configured to mirror a control current of the cascode transistor and provide a mirrored control current to the control terminal of the reference transistor. The cascode transistor may comprise an NPN bipolar transistor and the first current compensation mirror may comprise a pair of p-type metal-oxide-semiconductor (PMOS) transistors.

The current compensation block may comprise a second current compensation mirror configured to provide the mirrored control current to the control terminal of the transistor amplifier. The second current compensation mirror may comprise a PMOS transistor.

The second current compensation mirror may be configured to provide the mirrored control current to the control terminal of the transistor amplifier via the current difference block.

The size ratio of the first current compensation mirror to the second current compensation mirror may be substantially the same as the size ratio of the reference transistor to the transistor amplifier. For example, there may be a 20%, 10% or 5% difference between the size ratios.

The bias circuit may comprise a reference current mirror configured to receive a reference current and provide a scaled copy of the reference current to the sum node. The sum node may be configured to combine the scaled copy of the reference current with the bias current from the reference transistor to provide the difference current.

The reference current mirror may be configured to receive an additional current from the current compensation block and provide a scaled copy of the reference and additional currents to the sum node. The sum node may be configured to combine the scaled copy of the reference and additional currents with the bias current from the reference transistor to provide the difference current.

The reference current mirror may comprise a pair of transistors. The bias circuit may comprise a voltage shift transistor configured to provide a control current to control terminals of the transistors of the reference current mirror. The transistors of the reference current mirror may comprise PNP bipolar transistors or PMOS transistors. The voltage shift transistor may comprise a PMOS transistor.

The current difference block may comprise a current difference cascode transistor, which may have a gain value of about 1, but not greater than 1. The voltage shift transistor may be configured to provide a control voltage to a control terminal of the current difference cascode transistor. The current difference cascode transistor may comprise a PMOS transistor.

The bias circuit may comprise a voltage supply terminal. The current compensation block and the reference current mirror may be connected to the voltage supply terminal independently of one another.

The current difference block may be configured to amplify the difference current from the sum node and provide an amplified difference current to the control terminal of the transistor amplifier. The current difference block may comprise a current difference transistor and a current difference mirror. The current difference mirror may be configured to amplify an output current of the current difference transistor. The current difference transistor may comprise an NPN bipolar transistor. The current difference mirror may comprise a pair of PMOS transistors.

The current difference block may comprise a diode-connected transistor configured to provide an increased input voltage to the current difference transistor. The diode connected transistor may comprise an NPN bipolar transistor.

The low-pass filter block may comprise one or more resistor-capacitor (RC) circuits.

According to a further aspect, there is provided a transistor amplifier circuit comprising a transistor amplifier and any bias circuit described herein.

According to a further aspect, there is provided an apparatus comprising any bias circuit or transistor amplifier circuit described herein.

The apparatus may be one or more of an electronic device, a portable electronic device, a portable telecommunications device, a satellite navigation device and a module for any of these devices.

It will be appreciated that any components that are described herein as being coupled or connected could be directly or indirectly coupled or connected. That is, one or more components could be located between two components that are said to be coupled or connected whilst still enabling the required functionality to be achieved.

A description is now given, by way of example only, with reference to the accompanying drawings, in which.

As mentioned above, using integrated inductors in bias circuits can take up a large area of the silicon die and therefore may not be cost effective. One or more of the bias circuits described here can avoid the need for an integrated inductor.

Figure 1:
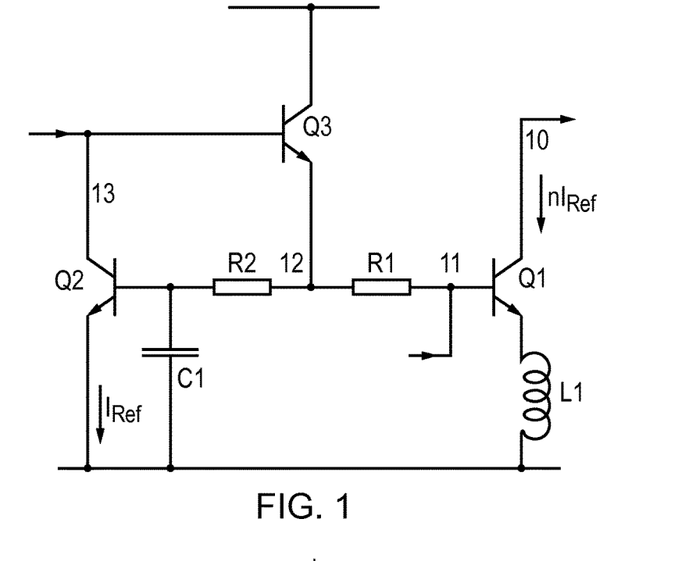
FIG. 1 illustrates schematically a bias circuit.

FIG. 1 illustrates schematically a bias circuit. A transistor amplifier is denoted Q1, and has an AC-coupled input terminal at node 11 and an output terminal at node 10. The bias circuit also has a ground inductor L1. The circuit receives an input reference current $I_{Ref}$ at node 13 which is input to a reference transistor Q2. A DC bias voltage is provided through a resistor R2 and a current compensation transistor Q3 to the control/base terminal of the reference transistor Q2. A copy of this DC bias voltage is also provided to the control/base terminal of the transistor amplifier Q1 through a resistor R1. By appropriate scaling of the device areas of the transistor amplifier Q1 and reference transistor Q2, and the values of resistors R1 and R2, a scaled copy of the reference current $nR_{Ref}$ flows through the transistor amplifier Q1 by forcing its base voltage to be essentially equal to that at the base of the reference transistor Q2. The currents through R1 and R2 are also scaled, but these are typically much smaller than the input reference current $I_{Ref}$ due to the transistor gain. The device area of the transistor amplifier Q1 is typically greater than the device area of the reference transistor Q2. A capacitor is included (denoted here as C1) to improve stability of the bias loop and strongly attenuate any RF signals leaking back into the bias circuit.

Such a simple structure performs quite well and is able to properly set the nominal bias conditions. The current compensation transistor Q3 provides a control/base current to reduce bias errors, but in so doing provides an additional impedance path to the supply for signals transiting between the control/base terminals of the transistor amplifier Q1 and the reference transistor Q2. In this way the reference transistor Q2 is somewhat isolated from the transistor amplifier Q1. To limit the losses of RF signals, the resistor R1 can have a resistance of at least 1 kΩ. Considering a current ratio of 10, R2 is >10 kΩ. Any changes in the DC bias voltage at the control/base terminal of the transistor amplifier Q1 are therefore absorbed by the bias circuit through this resistance network.

A particular difficulty occurs for two input signals of large amplitude with RF frequencies that are close together, e.g. 900 and 901 MHz. This creates a beat frequency (in this case 1 MHz) that can cause a low-frequency modulation of the DC bias voltage. The impedance presented by the bias circuit limits the circuit intermodulation performance because the bias circuit cannot source sufficient current to prevent unwanted bias shifts.

There will now be described an alternative amplifier bias circuit which exhibits behaviour close to an ideal inductor without the associated cost, takes up less silicon die area, and may provide a suitable compromise between low-frequency and RF impedances with acceptably few circuit errors.

Later examples depicted in the figures have been provided with reference numerals that correspond to similar features of earlier described examples. These numbered features may appear in the figures but may not be directly referred to within the description of these particular examples. This has been done to aid understanding, particularly in relation to the features of similar earlier described examples.

Figure 2:
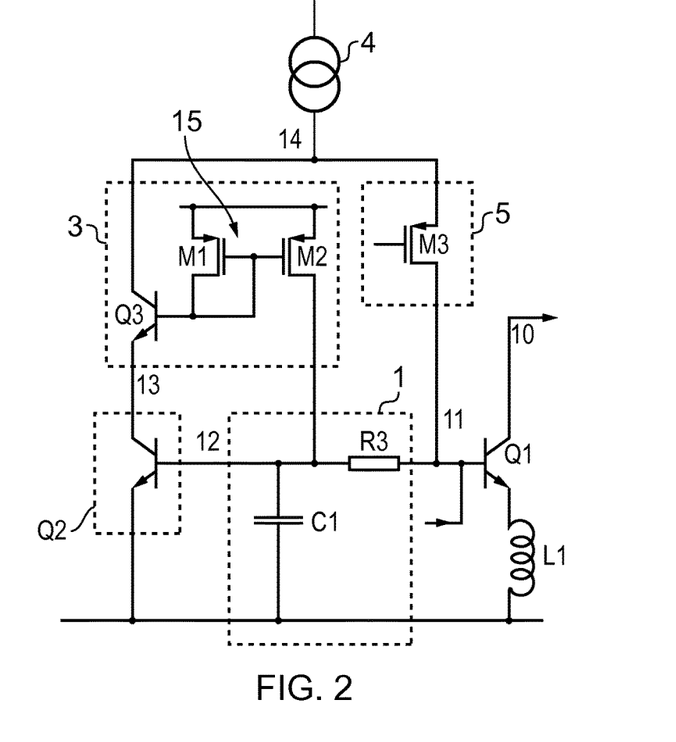
FIG. 2 illustrates schematically a bias circuit according to one example of the present disclosure.

FIG. 2 illustrates schematically a bias circuit for a transistor amplifier Q1 according to one example of the present disclosure. The bias circuit comprises a low-pass filter block 1, a reference transistor Q2, a current compensation block 3, a sum node 14, a reference current source 4, and a current difference block 5. In this example, the transistor amplifier Q1 and reference transistor Q2 are NPN bipolar transistors; the current compensation block 3 comprises an NPN bipolar (cascode) transistor Q3 and a pair of PMOS transistors M1 and M2. Transistors M1 and M2 together form a first current compensation mirror 15.

The current difference block 5 in this example comprises a PMOS (cascode) transistor M3, which provides current gain value of about 1. The cascode transistor M3 can provide for a low input impedance and high output impedance, and can provide some isolation from output back to the input.

An inductor L1 is connected between the emitter of the transistor amplifier Q1 and ground in order to provide emitter inductive degeneration. The base of the transistor amplifier Q1 is connected to an AC input terminal at node 11 that receives an AC input signal. The base terminal of a transistor is an example of a control terminal of the transistor. The collector of the transistor amplifier Q1 is connected to an AC output node 10 that provides an amplified AC output signal.

The low-pass filter block 1 is connected between the base terminal of the transistor amplifier Q1 and the base terminal of the reference transistor Q2. More particularly, the low-pass filter block 1 has in input terminal that is connected to the base of the transistor amplifier Q1, and has an output terminal that is connected to the base of the reference transistor Q2. In this example, the low-pass filter block 1 includes an RC circuit that comprises a filter resistor R3 in series between the input terminal and the output terminal of the low-pass filter block 1, and a filter capacitor C1 connected between the output terminal of the low-pass filter block 1 and ground. In this way, a DC bias voltage at the base terminal of the transistor amplifier Q1 is sensed through the low-pass filter block 1 and applied to the base terminal 12 of the reference transistor Q2. It will be appreciated that in other examples the low-pass filter block 1 can include a plurality of RC circuits in series with each other between the input terminal of the low-pass filter block 1 and the output terminal of the low-pass filter block 1.

The reference transistor Q2 provides a bias current at its collector terminal 13 in response to the DC bias voltage received at its base terminal 12. The emitter terminal of the reference transistor Q2 is connected to ground.

As indicated above, the current compensation block 3 includes a cascode transistor Q3 and a pair of PMOS transistors; a first compensation FET M1 and a second compensation FET M2. The emitter terminal of the cascode transistor Q3 is connected to the collector terminal 13 of the transistor amplifier Q2. In this way, the emitter terminal of the cascode transistor Q3 receives the bias current from the collector terminal 13 of the reference transistor Q2.

The base terminal of the cascode transistor Q3 is connected to the gate terminal of the first compensation FET M1 and the gate terminal of the second compensation FET M2. The gate terminal of the first compensation FET M1 is also connected to the gate terminal of the second compensation FET M2. The gate terminal of a FET is an example of a control terminal of the transistor. The drain of the first compensation FET M1 is connected to the base terminal of the cascode transistor Q3. The source of the first compensation FET M1 is connected to the source of the second compensation FET M2, and both sources can be connected to a bias potential such as a voltage supply rail/terminal. The drain of the second compensation FET M2 is connected to the base terminal 12 of the reference transistor Q2. In this way, the first compensation FET M1 and the second compensation FET M2 are connected together to provide a current mirror, which mirrors a base current of the cascode transistor Q3 in order to provide a control current to the base terminal 12 of the of the reference transistor Q2. In this way, almost none of the current at the base terminal 12 of the reference transistor Q2 is drawn through the low-pass filter block 1.

The sum node 14 is connected to the collector terminal of the cascode transistor Q3, the reference current source 4 and the source terminal of the current difference cascode transistor M3. The sum node 14 receives the bias current from the reference transistor Q2 via the cascode transistor Q3, and a reference current from the reference current source 4. The sum node provides a difference current to the source terminal of the current difference cascode transistor M3. In this way, the bias current and the reference current are combined such that a current signal representative of the difference between the bias current and the reference current is provided to the current difference cascode transistor M3 of the current difference block 5.

The current difference cascode transistor M3 receives the difference current from the sum node 14 at its source terminal, and outputs the difference current at its drain terminal. An example of how the gate terminal of the current difference cascode transistor M3 can be connected is described below with reference to FIGS. 6 and 7. The drain terminal of the current difference cascode transistor M3 is connected to the base terminal of the transistor amplifier Q1 at node 11 such that the difference current provides a bias current to the base terminal of the transistor amplifier Q1.

The bias circuit of FIG. 2 advantageously separates out the two functions of sensing the DC bias voltage and supplying a DC bias current to the transistor amplifier Q1. These two functions are performed respectively by the low-pass filter block 1 and the current difference block 5.

Assuming that the reference transistor Q2 presents a high input impedance, which arises both from the current gain β of the reference transistor Q2, and also from the current cancellation block 3, then essentially the DC bias voltage at the base of the reference transistor Q2 (node 12) is that present at the base of the transistor amplifier Q1 (at node 11) with the transfer function of the low-pass filter block 1. At low frequencies the transfer function is unity, and at RF frequencies it tends to zero. Assuming that almost no current is lost in the loop from the collector of the reference transistor Q2 to the base of the transistor amplifier Q1, through the current compensation block 3 and the current difference block 5, (that is the loop from node 13, through sum node 14 and on to node 11), then the current at the base terminal of the transistor amplifier Q1 will be due to the DC bias voltage at node 12 multiplied by the transconductance of the reference transistor Q2. Therefore, if the reference transistor Q2 is biased with 1 mA, the overall bias loop will provide an equivalent source impedance of 26Ω at ambient temperature. This is significantly lower than known prior art solutions. At RF frequencies the loop provides no gain, since the filter capacitor C1 filters out such signals. The impedance presented at the node 11 is simply determined by the series filter resistor R3 of the low-pass filter 1.

Figure 3:
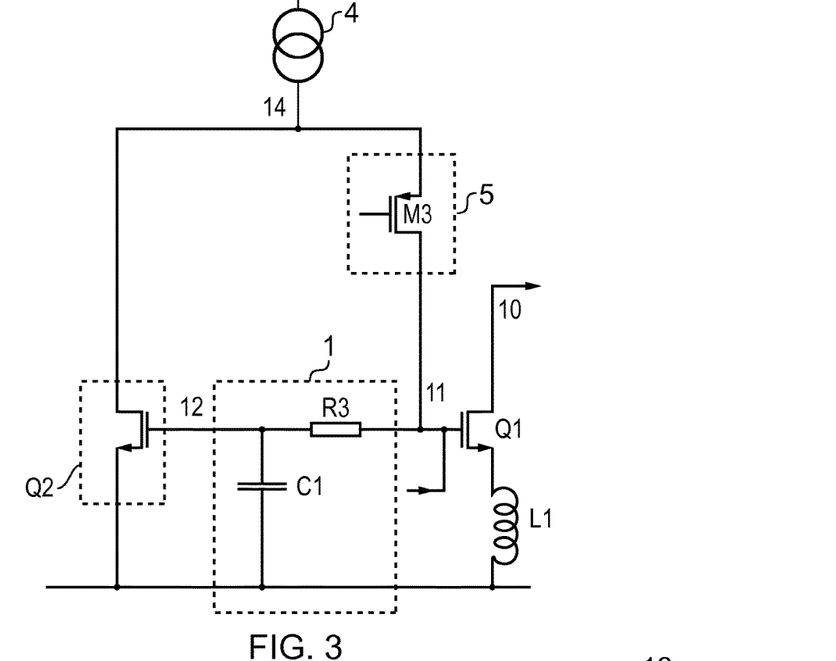
FIG. 3 illustrates schematically a bias circuit according to another example of the present disclosure.

FIG. 3 illustrates schematically a bias circuit according to another example of the present disclosure. In this example, the NPN bipolar transistors of the transistor amplifier Q1 and reference transistor Q2 are replaced by NMOS field effect transistors, but the same device area scaling is applied to set a desired current ratio between the reference transistor Q2 and the transistor amplifier Q1. The source terminal of the transistor amplifier Q1 and the source terminal of the reference transistor Q2 are connected to ground. Although the current difference block 5 is the same as described with reference to FIG. 2, the current compensation block 3 is not used in this example. As a result, the drain terminal of the reference transistor Q2 is connected directly to the sum node 14, which is also directly connected to the source terminal of the current difference cascode transistor M3. Furthermore, whilst in older CMOS processes the NMOS gate terminal can be isolating and requires no bias current, in most advanced CMOS nodes (45 nm and below) there can be some gate leakage which requires a bias current. This is provided in the present circuit by connecting the drain terminal of the current difference cascode transistor M3 to the gate terminal of the transistor amplifier Q1.

Figure 4:
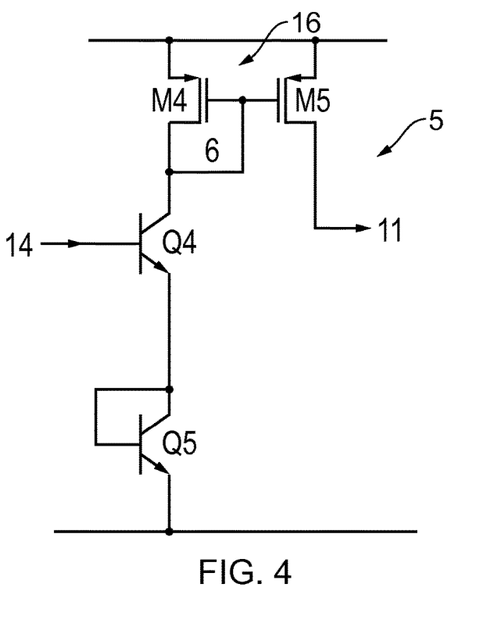
FIG. 4 illustrates schematically an alternative current difference block suitable for use with any bias circuit described herein.

FIG. 4 illustrates schematically an alternative current difference block 5 suitable for use with any bias circuit described herein. The current difference block 5 of FIG. 4 is shown with nodes labelled 14 and 11, which show how it can be connected to the correspondingly labelled nodes in FIG. 2 or FIG. 3. The PMOS current difference cascode transistor M3 of FIGS. 2 and 3 is replaced with a current amplifier circuit comprising a current difference transistor Q4 and a current difference mirror 16. The current difference mirror 16 is configured to amplify an output current of the current difference transistor Q4. In this example, the current different transistor Q4 is an NPN bipolar transistor and the current difference mirror 16 comprises a pair of PMOS transistors: a first current difference FET M4 and a second current difference FET M5. Unlike the current difference cascode transistor M3 of FIGS. 2 and 3, the current amplifier circuit of FIG. 4 may be used to provide a current gain of greater than 1.

The base terminal of the current difference transistor Q4 is connected to the sum node 14. The collector terminal of the current difference transistor Q4 is connected to the gate terminal of the first current difference FET M4 and the gate terminal of the second current difference FET M5. The gate terminal of the first current difference FET M4 is also connected to the gate terminal of the second current difference FET M5. The drain of the first current difference FET M4 is connected to the collector terminal of the current difference transistor Q4. The source of the first current difference FET M4 is connected to the source of the second current difference FET M5, and both sources can be connected to a bias potential such as a voltage supply rail. The drain of the second compensation FET M2 is connected to node 11, which it will be appreciated is also connected to the base terminal of the reference transistor (not shown in FIG. 4).

The base terminal of the current difference transistor Q4 receives a difference current from the sum node 14. The collector terminal (node 6) of the current difference transistor Q4 is connected to the current difference mirror 16 such that an amplified current is provided to node 11 by the drain terminal of the second current difference FET M5. The current gain from the input of the current difference block 5 at node 14 to the output of the current difference block 5 at node 11 is substantially equal to the current gain of the current difference transistor Q4 multiplied by the current gain of the current difference mirror 16 (i.e. the area ratio of the first and the second current difference FETs M4 and M5).

In the example of FIG. 4, an optional diode-connected transistor Q5 is also provided to elevate the input potential of the current difference transistor Q4 and improve operation of the circuit. For example, the input voltage may be set to the sum of the base-emitter voltages of the current difference transistor Q4 and the diode-connected transistor Q5. In this way the voltage at the node 14 is typically 1.5V. This is the voltage imposed at the current sum node. In some implementations this may be advantageous. In this example, the diode-connected transistor Q5 is an NPN bipolar transistor with its emitter terminal connected to ground, and its collector terminal and base terminal connected to the emitter terminal of the current difference transistor Q4. In examples for which the device Q5 is left out, the emitter of Q4 is tied to ground.

Figure 5:
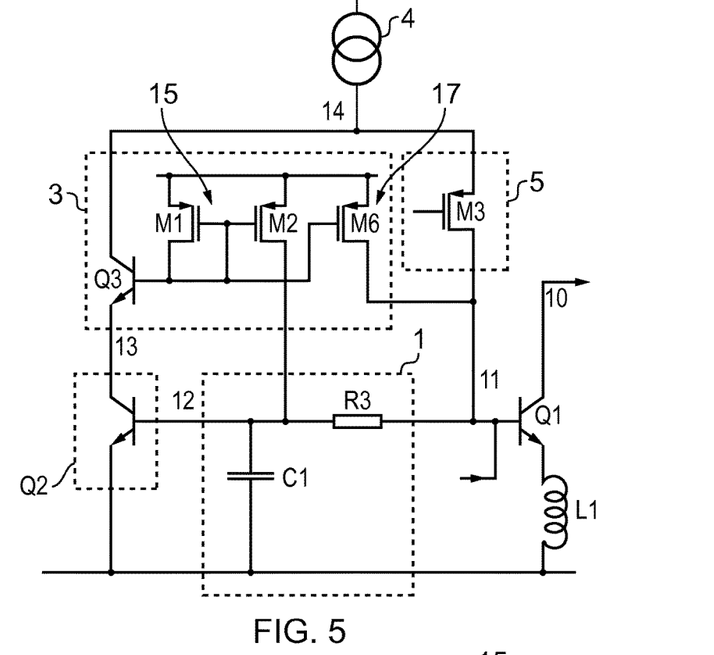
FIG. 5 illustrates schematically a bias circuit according to another example of the present disclosure.

FIG. 5 illustrates schematically a bias circuit according to another example of the present disclosure. In this example, an extension of the aforementioned current compensation block 3 allows cancellation or reduction of base current terms, to first order, without having to stack as many devices. It therefore lends itself to an implementation for reduced supply voltages down to 1.8V, such as for two-cell battery operated systems.

The main circuit blocks are denoted as previously and will not be described again in detail here. The current compensation block 3 of FIG. 5 is extended with a second current compensation mirror, which is provided by the first compensation FET M1 and a third compensation FET M6 17. As shown, the gate terminal of the third compensation FET M6 is connected to the base terminal of the cascode transistor Q3. The drain terminal of the third compensation FET M6 is connected to the base terminal (node 11) of the transistor amplifier Q1 as shown in FIG. 5. Alternatively, the drain terminal of the third compensation FET M6 may be connected to the source terminal (sum node 14) of the current difference cascode transistor M3. In this example, the third compensation FET M6 has a device size scaled to the ratio of the currents flowing in the reference transistor Q2 and transistor amplifier Q1 so as to provide the required current to the base terminal of the transistor amplifier Q1. In this way, the second current compensation mirror 17 provides an additional current term (i.e. the mirrored base current of the cascode transistor Q3) either directly or indirectly to the base terminal of the transistor amplifier Q1. That is, the mirrored base current can be injected at the output terminal or input terminal of the current difference block 5. With this bias circuit, the base current requirements of the transistor amplifier Q1 may not create a significant error in the overall DC biasing.

Figure 6:
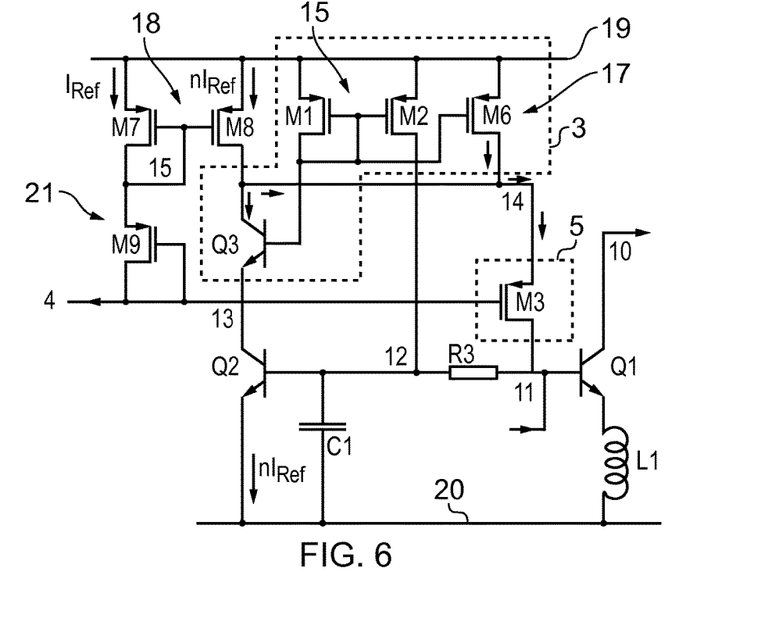
FIG. 6 illustrates schematically a bias circuit according to another example of the present disclosure.

FIG. 6 illustrates schematically a bias circuit according to another example of the present disclosure. In addition to the first current compensation mirror 15 and the second current compensation mirror 17 of FIG. 5, this bias circuit of FIG. 6 also comprises a reference current mirror 18 that is used to provide the reference current to the sum node 14 and also to provide a bias to the current difference cascode transistor M3. Also, in contrast to FIG. 5, the drain terminal of the third compensation FET M6 is connected to the source terminal of current difference cascode transistor M3.

In this example, the reference current mirror 18 comprises a first current source FET M7 and a second current source FET M8. The source terminal of the first current source FET M7 is connected to a voltage supply rail 19. The source terminal of the second current source FET M8 is also connected to the voltage supply rail 19. The gate terminal of the first current source FET M7 is connected to the gate terminal of the second current source FET M8. The gate terminal of the first current source FET M7 is connected to the drain terminal of the first current source FET M7. The drain terminal of the second current source FET M8 is connected to the sum node 14, and is configured to provide the reference current to the sum node 14. The drain terminal of the first current source FET M7 is also connected to the source terminal of a voltage shift FET M9. Both the gate and the drain of the voltage shift FET M9 are connected to gate of the current difference cascode transistor M3. The voltage shift FET M9 is a diode connected input MOS to create an input voltage shift. The drain of the voltage shift FET M9 is connected to the input reference current source 4 of the complete bias circuit (where it is applied as the input current source 4 as of FIGS. 2, 3 and 5). In this way, a suitable bias voltage is provided to the gate of the current difference cascode transistor M3.

The reference current mirror 18 provides a scaled copy of the reference current $nI_{Ref}$ to the sum node 14. In this scenario, the sum node 14 is configured to combine the scaled copy of the reference current $nI_{Ref}$ with the bias current from the reference transistor Q2 (received via cascode transistor Q3) to provide the difference current to the source of the current difference cascode transistor M3. As before, the difference current then flows through the current difference block 5 to bias the transistor amplifier Q1.

As described above, the source terminals of each of the PMOS transistors M1, M2 and M6 are connected to the voltage supply rail 19 independently of the PMOS transistors M7 and M8. That is, the first current compensation mirror 15 and the second current compensation mirror 17 are connected to the power supply 19 independently of the reference current mirror 18. This feature reduces the number of devices stacked between the voltage supply rail 19 and ground 20, thereby allowing operation from a lower supply voltage. Furthermore, the second current compensation mirror 17 is scaled in size to the first current compensation mirror 15 at substantially the same ratio as the transistor amplifier Q1 to the reference transistor Q2. In this way, the current provided by the second current compensation mirror 17 is nominally equal to the current required by the transistor amplifier Q1.

The current from the collector terminal of the cascode transistor Q3 should be approximately equal to the current from the reference current mirror 18, and the output current from the current difference block 5 should be approximately equal to that provided by the second current compensation mirror 17.

Figure 7:
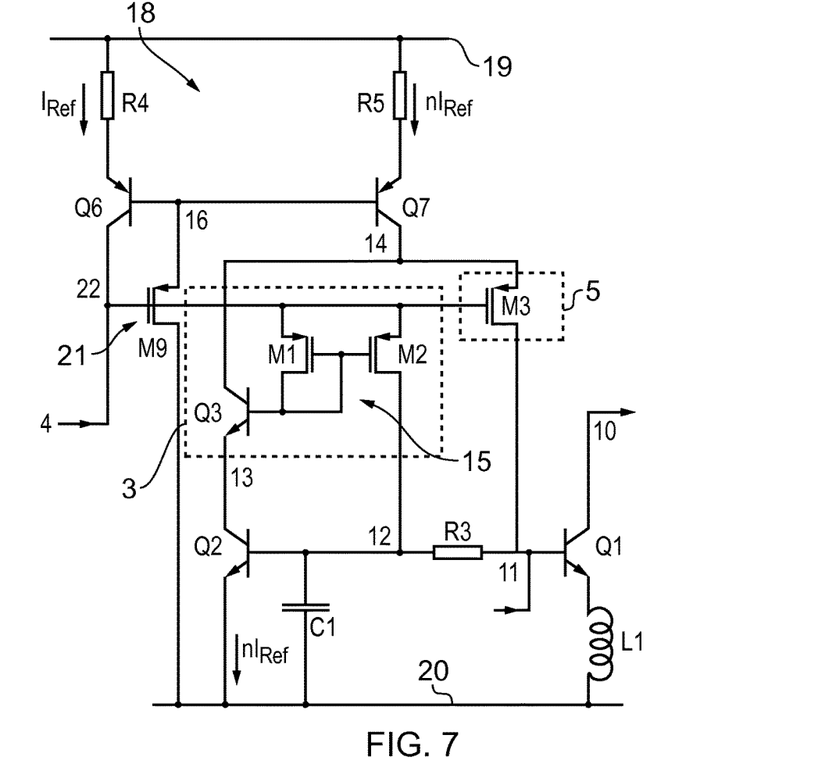
FIG. 7 illustrates schematically a bias circuit according to another example of the present disclosure.

FIG. 7 illustrates schematically a bias circuit according to another example of the present disclosure. Similar to the circuit of FIG. 6, a reference current mirror 18 is used to provide the reference current to the sum node 14 and also to provide a bias to the current difference cascode transistor M3. In this example, the reference current mirror 18 is provided by two PNP bipolar transistors: a first current source BJT Q6 and a second current source BJT Q7. The collector terminal of first current source BJT Q6 is connected to the reference current source 4. The emitter terminals of both the first current source BJT Q6 and the second current source BJT Q7 are connected to a voltage supply rail 19. In this example, the first current source BJT Q6 is connected to the voltage supply rail 19 via a series connected first current source resistor R4, and the second current source BJT Q7 is connected to the voltage supply rail 19 via a series connected second current source resistor R5. The base terminal of the first current source BJT Q6 is connected to the base terminal of the second current source BJT Q7. The base terminals of both the first current source BJT Q6 and the second current source BJT Q7 are also connected the source terminal of the voltage shift FET M9. The collector terminal of the first current source BJT Q6 is also connected to the gate terminal of the voltage shift FET M9 at node 22. The drain of the voltage shift FET M9 is connected to the input reference current source 4 of the complete bias circuit. The collector terminal of the second current source BJT Q7 is connected to the sum node 14.

The resistor values of the first current source resistor R4 and the second current source resistor R5, and the transistor areas of the first current source BJT Q6 and the second current source BJT Q7, are chosen so as to provide a particular ratioed output current $nI_{Ref}$ from the reference current $I_{Ref}$ received at the collector terminal of the first current source BJT Q6. As before, the scaled copy of the reference current from the reference current mirror 18 is summed with the bias current from the reference transistor Q2 at the sum node 14, and the difference current is passed through the current difference cascode transistor M3 to supply the base terminal of the transistor amplifier Q1.

The PMOS transistor M9 is included to provide base currents to the first current source BJT Q6 and the second current source BJT Q7 so that they do not introduce any current error terms. The source terminal of the transistor M9 is connected to the base terminals of the first current source BJT Q6 and the second current source BJT Q7, and the drain terminal is connected to ground. In addition, the gate terminal of transistor M9 is connected to the gate terminal of the current difference cascode transistor M3 to provide a gate voltage. In this way, M9 serves as a base current compensation circuit for the pnp mirror devices Q6 and Q7. This is particularly important since typical pnp betas can be low, for instance down to 50 or lower, which could cause serious current errors if the base currents were drawn from the normal bias current source rather than provided "for free" by M9.

In this particular example, the source terminals of both the first compensation FET M1 and the second compensation FET M2 are connected to the collector terminal of the first current source BJT Q6 in order to provide an additional input current to the reference current mirror 18. Hence the input current of the reference current mirror 18 equals the sum of the reference current $I_{Ref}$ and the additional current. The additional current is twice the base current of cascode transistor Q3—once from the first current source M1 and once from the second current source M2. The reference current mirror 18 is therefore configured to provide a scaled copy of the reference and additional currents to the sum node 14, which is configured to combine the scaled copy of the reference and additional currents with the bias current from the reference transistor Q2 to provide the difference current.

For high values of β, typically >100, the control/base current of cascode transistor Q3 equals the base current of reference transistor Q2. The output of the reference current mirror 18 at the collector terminal of the second current source BJT Q7 equals n times the input current, where n represents the input to output current ratio. The output current from the collector terminal of the cascode transistor Q3 equals the emitter current of the reference transistor Q2 less two base current terms flowing through the first compensation FET M1 and the second compensation FET M2. Therefore, the reference current mirror 18 provides an extra 2n base current terms, whereas the cascode transistor Q3 lacks two base current terms. It follows that when the current through reference transistor Q2 is equal to n times the reference current, the residual current through the current difference cascode transistor M3 is equal to 2(n+1) base currents of reference transistor Q2. By suitable choice of n, this residual current can be designed to be equal to the base current required by the transistor amplifier Q1.

Figure 8A:
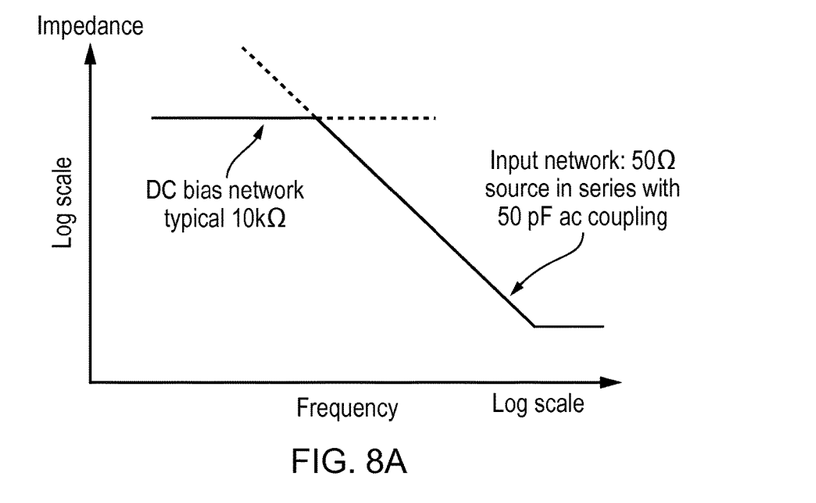
FIG. 8a illustrates graphically an impedance curve representative of the bias circuit of FIG. 1.
Figure 8B:
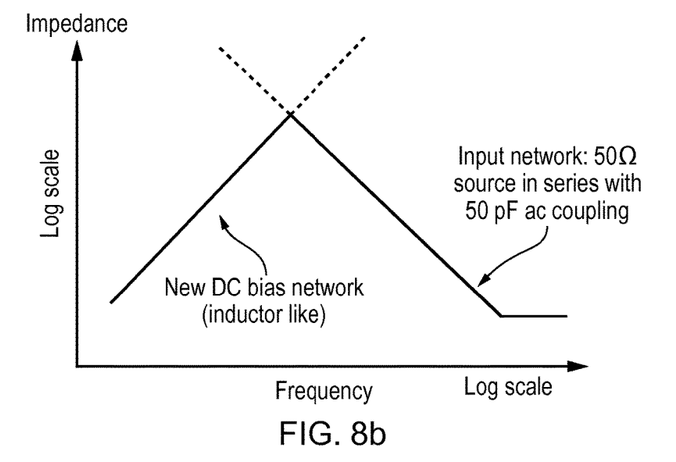
FIG. 8b illustrates graphically an impedance curve representative of the bias circuits described herein.

FIG. 8*a* illustrates an impedance curve for the bias circuit of FIG. 1. FIG. 8*b* illustrates an example impedance curve for the bias circuits of FIGS. 2, 3, 5, 6 and 7. The impedance measured at the input of the transistor amplifier is the combination of the impedance presented by the DC bias circuit in parallel with that provided by the RF source network. The RF is typically from a 50Ω source impedance, in series with an AC coupling capacitor, typically in the range from 20 to 50 pF.

As shown in FIG. 8*a*, the bias circuit of FIG. 1 presents a consistently high impedance at low frequencies due to the DC bias network, which may be about 10 kΩ. Then at a certain frequency the impedance starts to fall due to the influence of the input network, which may be a 50Ω source impedance in series with a 50 pF coupling capacitor.

In contrast, as shown in FIG. 8*b*, the bias circuits of FIGS. 2, 3, 5, 6 and 7 present a lower impedance at lower frequencies which increases as the frequency increases. This impedance response is due to the inductor-like nature of the bias network. Again, at a certain frequency the impedance starts to fall due to the influence of the input network.

The two circuits were then simulated under the following conditions to determine the respective lower intermodulation products: 10 mA transistor amplifier bias current; 1 mA through the reference transistor; 50Ω source and load impedances; 50 pF AC coupling capacitor; 0.5 nH degeneration inductor; and 2.5 GHz signal frequency.

Figure 9A:
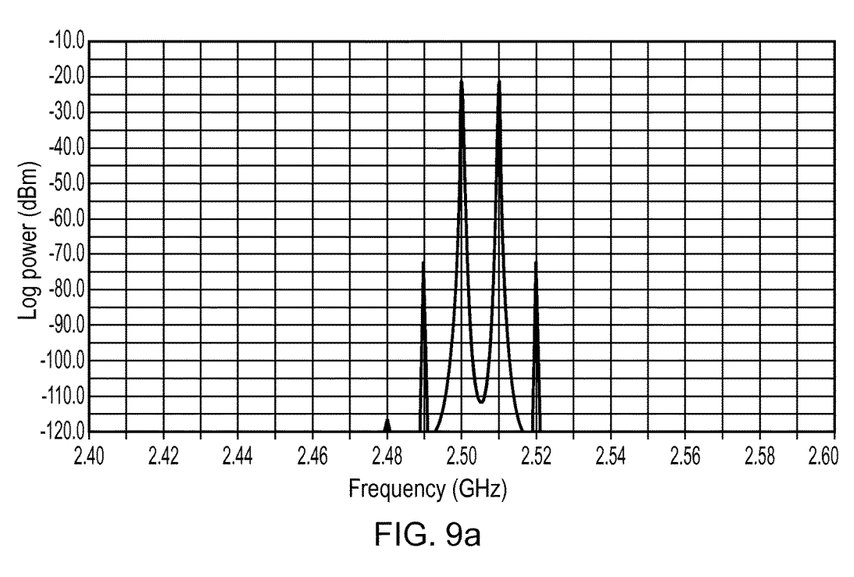
FIG. 9a illustrates graphically the lower intermodulation products of the bias circuit of FIG. 1.
Figure 9B:
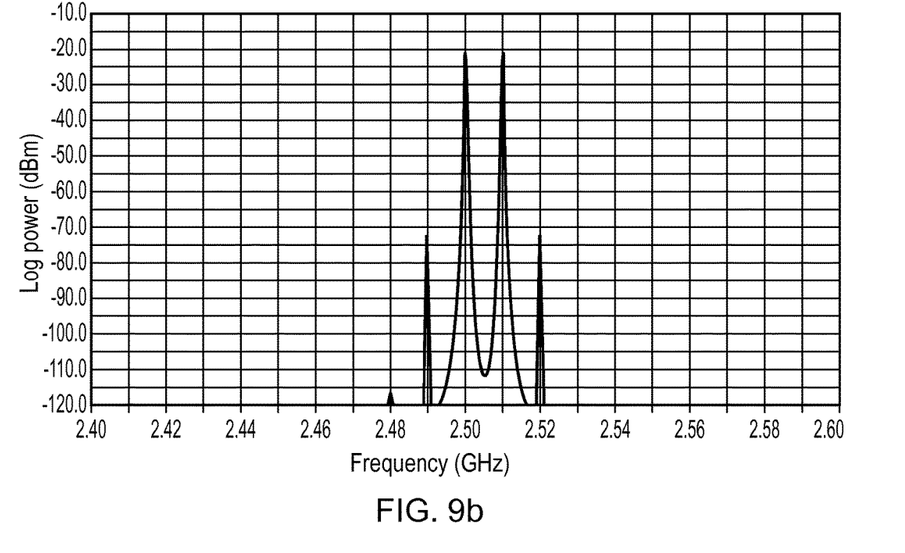
FIG. 9b illustrates graphically the lower intermodulation products of the bias circuits described herein.

FIG. 9a illustrates the lower intermodulation products of the bias circuit of FIG. 1. FIG. 9b illustrates the lower intermodulation products of the bias circuits of FIGS. 2, 3, 5, 6 and 7. As can be seen in FIG. 9a, the output spectrum for FIG. 1 exhibits two outer peaks with an amplitude of about 90 dBm, which are caused by the non-linearity of the bias circuit of FIG. 1. As shown in FIG. 9b, the amplitude of the corresponding peaks is about 5-10 dBm lower for the bias circuit of FIGS. 2, 3, 5, 6 and 7. This results in an increase in IP3 from 6.49 dBm to 13.66 dBm.

Figure 10:
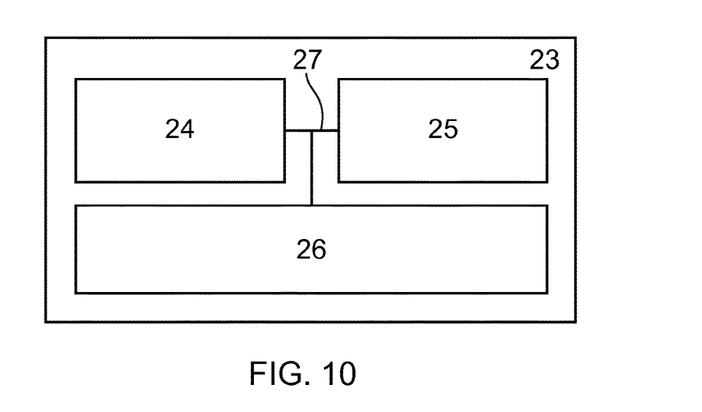
FIG. 10 illustrates schematically an apparatus comprising a bias circuit described herein.

FIG. 10 illustrates schematically an apparatus 23 comprising a bias circuit 24 as described herein, a processor 25 and a storage medium 26, which are electrically connected to one another by a data bus 27. The apparatus 23 may be one or more of an electronic device, a portable electronic device, a portable telecommunications device, a satellite navigation device and a module for any of these devices.

The processor 25 is configured for general operation of the electronic device/apparatus 23 by providing signalling to, and receiving signalling from, the other components to manage their operation. The storage medium 26 is configured to store computer code configured to perform, control or enable operation of the electronic device/apparatus 23. The storage medium 26 may also be configured to store settings for the other components. The processor 25 may access the storage medium 26 to retrieve the component settings in order to manage the operation of the other components. The processor 25 may be a microprocessor, including an Application Specific Integrated Circuit (ASIC). The storage medium 26 may be a temporary storage medium such as a volatile random access memory. On the other hand, the storage medium 26 may be a permanent storage medium such as a hard disk drive, a flash memory, or a non-volatile random access memory.

It will be appreciated from the above description that many of the transistors disclosed in this document could be either a field effect transistor (FET) or a bipolar junction transistor (BJT).

The invention claimed is:

1. A bias circuit for a transistor amplifier, the bias circuit comprising a low-pass filter block, a reference transistor, a sum node, a reference current source, and a current difference block, wherein
the low-pass filter block is configured to sense a DC bias voltage at a control terminal of the transistor amplifier and provide the DC bias voltage to a control terminal of the reference transistor;
the reference transistor is configured to output a bias current in response to the DC bias voltage and provide the bias current to the sum node;
the sum node is configured to receive a reference current from the reference current source and combine the reference current with the bias current from the reference transistor to provide a difference current; and
the current difference block includes a gate, a first current electrode, and a second current electrode, and is configured to receive the difference current from the sum node at the first current electrode and provide the difference current at the second current electrode to the control terminal of the transistor amplifier.

2. The bias circuit of claim 1, wherein the bias circuit comprises a current compensation block configured to receive the bias current from the reference transistor and return a control current to the control terminal of the reference transistor.

3. The bias circuit of claim 2, wherein the current compensation block comprises a cascode transistor and a first current compensation mirror, and wherein the first current compensation mirror is configured to mirror a control current of the cascode transistor and provide a mirrored control current to the control terminal of the reference transistor.

4. The bias circuit of claim 3, wherein the current compensation block comprises a second current compensation mirror configured to provide the mirrored control current to the control terminal of the transistor amplifier.

5. The bias circuit of claim 4, wherein the second current compensation mirror is configured to provide the mirrored control current to the control terminal of the transistor amplifier via the current difference block.

6. The bias circuit of claim 4, wherein the size ratio of the first current compensation mirror to the second current compensation mirror is substantially the same as the size ratio of the reference transistor to the transistor amplifier.

7. The bias circuit claim 2, wherein the bias circuit comprises a reference current mirror configured to receive a reference current and provide a scaled copy of the reference current to the sum node, and wherein the sum node is configured to combine the scaled copy of the reference current with the bias current from the reference transistor to provide the difference current.

8. The bias circuit of claim 7, wherein the reference current mirror is configured to receive an additional current from the current compensation block and provide a scaled copy of the reference and additional currents to the sum node, and wherein the sum node is configured to combine the scaled copy of the reference and additional currents with the bias current from the reference transistor to provide the difference current.

9. The bias circuit of claim 7, wherein the reference current mirror comprises a pair of transistors, and wherein the bias circuit comprises a voltage shift transistor configured to provide a control current to control terminals of the transistors of the reference current mirror.

10. The bias circuit of claim 9, wherein the current difference block comprises a current difference cascode transistor, and wherein the voltage shift transistor is configured to provide a control voltage to a control terminal of the current difference cascode transistor.

11. The bias circuit of claim 7, wherein the bias circuit comprises a voltage supply terminal, and wherein the current compensation block and the reference current mirror are connected to the voltage supply terminal independently of one another.

12. The bias circuit of claim 1, wherein the current difference block comprises a current difference transistor and a current difference mirror, the current difference mirror configured to amplify an output current of the current difference transistor.

13. The bias circuit of claim 12, wherein the current difference block comprises a diode-connected transistor configured to provide an increased input voltage to the current difference transistor.

14. The bias circuit of claim 1, wherein the low-pass filter block comprises one or more resistor-capacitor circuits.

15. A transistor amplifier circuit comprising a transistor amplifier and the bias circuit of claim 1.

16. A bias circuit for a transistor amplifier, the bias circuit comprising a low-pass filter block, a reference transistor, a sum node, a reference current source, and a current difference block, wherein the low-pass filter block is configured to sense a DC bias voltage at a control terminal of the transistor amplifier and provide the DC bias voltage to a control terminal of the reference transistor;

the reference transistor is configured to output a bias current in response to the DC bias voltage and provide the bias current to the sum node;

the sum node is configured to receive a reference current from the reference current source and combine the reference current with the bias current from the reference transistor to provide a difference current; and the current difference block is configured to receive the difference current from the sum node and transfer the difference current to the control terminal of the transistor amplifier, wherein the current difference block provides unity gain.

17. The bias circuit of claim 16, wherein the bias circuit comprises a current compensation block configured to receive the bias current from the reference transistor and return a control current to the control terminal of the reference transistor.

18. The bias circuit of claim 17, wherein the current compensation block comprises a cascode transistor and a first current compensation mirror, and wherein the first current compensation mirror is configured to mirror a control current of the cascode transistor and provide a mirrored control current to the control terminal of the reference transistor.

19. The bias circuit of claim 18, wherein the current compensation block comprises a second current compensation mirror configured to provide the mirrored control current to the control terminal of the transistor amplifier.

20. A bias circuit for a transistor amplifier, the bias circuit comprising a low-pass filter block, a reference transistor, a sum node, a reference current source, and a current difference block, wherein the low-pass filter block is configured to sense a DC bias voltage at a control terminal of the transistor amplifier and provide the DC bias voltage to a control terminal of the reference transistor;

the reference transistor is configured to output a bias current in response to the DC bias voltage and provide the bias current to the sum node;

the sum node is configured to receive a reference current from the reference current source and combine the reference current with the bias current from the reference transistor to provide a difference current; and the current difference block is configured to receive the difference current from the sum node and transfer the difference current without amplification to the control terminal of the transistor amplifier.

* * * * *